(12) United States Patent  
Anthis et al.

(10) Patent No.: US 9,390,940 B2
(45) Date of Patent: Jul. 12, 2016

(54) METHODS OF ETCHING FILMS COMPRISING TRANSITION METALS

(71) Applicant: Applied Materials, Inc., Santa Clara, CA (US)

(72) Inventors: Jeffrey W. Anthis, San Jose, CA (US); Benjamin Schmiege, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/206,474

(22) Filed: Mar. 12, 2014

(65) Prior Publication Data

US 2014/0273492 A1 Sep. 18, 2014

Related U.S. Application Data

(60) Provisional application No. 61/779,583, filed on Mar. 13, 2013, provisional application No. 61/892,186, filed on Oct. 17, 2013.

(51) Int. Cl.

| H01L 21/302 | (2006.01) |
| H01L 21/3213 | (2006.01) |
| C23F 1/00 | (2006.01) |
| H01J 37/32 | (2006.01) |
| C23F 1/12 | (2006.01) |
| C23F 4/00 | (2006.01) |

(52) U.S. Cl.
CPC ............ *H01L 21/32135* (2013.01); *C23F 1/00* (2013.01); *C23F 1/12* (2013.01); *C23F 4/00* (2013.01); *H01J 37/32862* (2013.01); *H01L 21/32136* (2013.01)

(58) Field of Classification Search
None
See application file for complete search history.

(56) References Cited

U.S. PATENT DOCUMENTS

| 5,186,718 | A | | 2/1993 | Tepman et al. | |
| 5,431,774 | A | * | 7/1995 | Douglas | C23F 4/00 216/107 |
| 6,284,146 | B1 | * | 9/2001 | Kim | C23F 4/00 216/13 |
| 6,350,689 | B1 | * | 2/2002 | Ho et al. | 438/687 |
| 6,352,081 | B1 | * | 3/2002 | Lu et al. | 134/22.1 |
| 2002/0179569 | A1 | | 12/2002 | Outka et al. | |
| 2003/0013314 | A1 | | 1/2003 | Ying et al. | |
| 2003/0170640 | A1 | | 9/2003 | Milton | |

(Continued)

OTHER PUBLICATIONS

K. Chi et al. "Etching of Copper at High Rates via Generation of Volatile Copper Species", SPIE, vol. 1593, year 1991, pp. 157-160.*

(Continued)

*Primary Examiner* — Jiong-Ping Lu
(74) *Attorney, Agent, or Firm* — Servilia Whitney LLC

(57) ABSTRACT

Provided are methods for etching films comprising transition metals. Certain methods involve activating a substrate surface comprising at least one transition metal, wherein activation of the substrate surface comprises exposing the substrate surface to heat, a plasma, an oxidizing environment, or a halide transfer agent to provide an activated substrate surface; and exposing the activated substrate surface to a reagent comprising a Lewis base or pi acid to provide a vapor phase coordination complex comprising one or more atoms of the transition metal coordinated to one or more ligands from the reagent. Certain other methods provide selective etching from a multi-layer substrate comprising two or more of a layer of Co, a layer of Cu and a layer of Ni.

17 Claims, 8 Drawing Sheets

(56) References Cited

U.S. PATENT DOCUMENTS

2005/0167399 A1* 8/2005 Ludviksson et al. ............ 216/67
2010/0120245 A1 5/2010 Tjandra et al.
2011/0117728 A1 5/2011 Su et al.

OTHER PUBLICATIONS

PCT International Search Report and Written Opinion in PCT/US2014/025406, dated Jun. 16, 2014, 10 pages.

Agarwal, Ankur et al., Plasma atomic layer etching using conventional plasma equipment, J. Vac. Sci. Technol. A vol. 27 No. 1 Jan./Feb. 2009, 37-50.

Athavale, Satish D. et al., Realization of atomic layer etching of silicon, J. Vac. Sci. Technol. B vol. 14 No. 6 Nov./Dec. 1996, 3702-3705.

Sacconi, L. et al., Metal Complexes of N,N,N',N'-Tetramethyldiamines. I. Nickel(II) and Cobalt(II) Complexes, Inorganic Chemistry vol. 6 No. 2 Feb. 1967, 262-267.

PCT International Preliminary Report on Patentability in PCT/US2014/025406, mailed Sep. 24, 2015, 7 pages.

\* cited by examiner

METHODS OF ETCHING FILMS COMPRISING TRANSITION METALS

CROSS-REFERENCE TO RELATED APPLICATIONS

This application claims priority to U.S. Provisional Application Nos. 61/779,583, filed Mar. 13, 2013 and 61/892,186, filed Oct. 17, 2013, the entire contents of both of which are herein incorporated by reference in their entirety.

TECHNICAL FIELD

Aspects of the present invention relates generally to methods of etching films. In particular, aspects of the invention relates to etching films comprising transition metals for semiconductor devices.

BACKGROUND

Deposition of films on a substrate surface is an important process in a variety of industries including semiconductor processing, diffusion barrier coatings and dielectrics for magnetic read/write heads. Chemical vapor deposition (CVD) and atomic layer deposition (ALD) are two deposition processes used to form or deposit various materials on a substrate. In general, CVD and ALD processes involve the delivery of gaseous reactants to the substrate surface where a chemical reaction takes place under temperature and pressure conditions favorable to the thermodynamics of the reaction. However, a common problem with one or more these deposition processes is the unwanted deposition onto deposition chamber walls, showerhead, etc. For example, if cobalt films are deposited, there is a possibility for the buildup of undesired cobalt metal or compounds (e.g., carbidic cobalt) on the walls of the chamber. It then becomes necessary to remove this buildup. There is thus a need for methods of cleaning such buildup from deposition equipment. In particular, it would be particularly advantageous to have self-limiting etch methods, which would yield greater control during etch.

Additionally, in the semiconductor industry, miniaturization requires atomic level control of thin film deposition to produce conformal coatings on high aspect structures. One method for deposition of thin films with control and conformal deposition is atomic layer deposition (ALD), which employs sequential, surface reactions to form layers of precise thickness. Most ALD processes are based on binary reaction sequences which deposit a binary compound film. Because the surface reactions are sequential, the two gas phase reactants are not in contact, and possible gas phase reactions that may form and deposit particles are limited. However, before the present invention, there has not been a commercially viable way to delicately etch films with control and conformality. For example, while there have been wet etch methods proposed for cobalt, there is still a need for dry methods to remove cobalt and/or cobalt residue, and preferably in situ methods that are self-limiting and allow for precise control over etch rate. Even more particularly, a method that is selective for a particular metal is desired, as it would provide even more control over the etching process.

SUMMARY

One aspect of the invention pertains to a method of etching a substrate. the method comprises activating a substrate surface comprising at least one transition metal, wherein activation of the substrate surface comprises exposing the substrate surface to heat, a plasma, an oxidizing environment, or a halide transfer agent to provide an activated substrate surface; and exposing the activated substrate surface to a reagent comprising a Lewis base or pi acid to provide a vapor phase coordination complex comprising one or more atoms of the transition metal coordinated to one or more ligands from the reagent.

In one or more embodiments, the Lewis base or pi acid comprises CO, $PR^1_3$, wherein each $R^1$ is independently a C1-C6 alkyl group, 1,2-bis(difluorophosphino)ethane, $N_2O$, NO, $NH_3$, $NR^2_3$, wherein each $R^2$ is independently hydrogen C1-C6 branched or unbranched, substituted or unsubstituted, alkyl, allyl or cyclic hydrocarbon or heteroatomic group, or a compound having the structure:

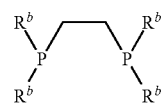

wherein each $R^b$ is independently hydrogen, R or C1-C4 alkyl. In some embodiments, the pi acid comprises $AlH_nX_m$-$R^c_p$, wherein X is a halogen, the sum of n+m+p is 3, and $R^c$ is C1-C6 alkyl. In one or more embodiments, activation of the substrate surface provides a surface termination which will react with a Lewis acid and/or pi acid. In some embodiments, the Lewis base or pi acid comprises a chelating amine selected from the group consisting of N,N,N',N'-tetramethylethylene diamine, ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is C1-C6 alkyl.

The activation of the substrate surface can take several forms. In one or more embodiments, activation of the substrate surface comprises exposing the substrate surface to heat. In some embodiments, exposure of the substrate surface to heat and the reagent occur simultaneously or substantially simultaneously.

In one or more embodiments, activation of the substrate surface comprises exposing the substrate surface to a plasma. In some embodiments, exposure of the substrate surface to the plasma and the reagent occur simultaneously or substantially simultaneously. In further embodiments, the plasma comprises $H_2$, NO, $N_2O$, $NF_3$, $Cl_2$, Ar or $N_2$. In one or more embodiments, the plasma comprises $N_2O$, and exposure of the substrate surface to the $N_2O$ results in a —NO surface termination.

In some embodiments, activation of the substrate surface comprises exposure to a halide transfer agent. In further embodiments, the halide transfer agent comprises $I_2$, $Br_2$, $Cl_2$, a trialkylsilyl halide or an alkyl halide, wherein the alkyl group may be C1-C6 alkyl.

In one or more embodiments, activation of the substrate surface comprises exposure of the substrate surface to an oxidizing environment. In further embodiments, exposure of the substrate surface to an oxidizing environment comprises exposing the substrate surface to $O_2$, $O_3$, $N_2O$, NO, $Br_2$, $F_2$, $I_2$ or $Cl_2$.

In some embodiments, the transition metal comprises an element selected from the group consisting of Co, Cu, Ru, Ni, Fe, Pt, Mn and Pd. In one or more embodiments, the substrate surface comprises about 90 to about 100% transition metal and 0 to about 10% carbon.

There are also other variants of the method. In one or more embodiments, the substrate surface overlies a deposition chamber wall or showerhead. In some embodiments, the method further comprises purging the vapor phase coordination complex.

A second aspect of the invention pertains to a method of etching a multi-layer substrate. The method comprises providing a multi-layer substrate comprising two or more of a layer of Co, a layer of Cu and a layer of Ni; activating a surface of the layer of Co, layer of Cu or layer of Ni, wherein activation of the substrate surface comprises exposing the substrate surface to heat, a plasma or a halide transfer agent to provide an activated substrate surface; and exposing the activated substrate surface to a chelating amine at a first temperature such that the chelating amine will only form a volatile metal coordination complex with one of Co, Cu or Ni at the first temperature.

In one or more embodiments, the method further comprises exposing the activated substrate surface to a chelating amine at a second temperature, such that the chelating amine will only form a volatile metal coordination complex with one of Co, Cu or Ni at the second temperature. In some embodiments, the chelating amine has a structure represented by:

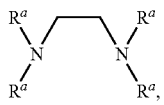

wherein each $R^a$ is independently hydrogen or C1-C4 alkyl, with the proviso that not all of the $R^a$ groups are hydrogen. In some embodiments, the chelating amine is selected from the group consisting of N,N,N',N'-tetramethylethylene diamine and N,N'-dimethylethylenediamine. In one or more embodiments, the method further comprises purging the coordination complex.

A third aspect of the invention pertains to a method of etching a substrate, the method comprising: activating a substrate surface comprising cobalt or copper, wherein activation of the substrate surface comprises exposing the substrate surface to $Br_2$ to provide an activated substrate surface; and exposing the activated substrate surface to a reagent comprising TMEDA to provide a vapor phase coordination complex comprising one or more atoms of the cobalt or copper coordinated to one or more ligands from the reagent.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
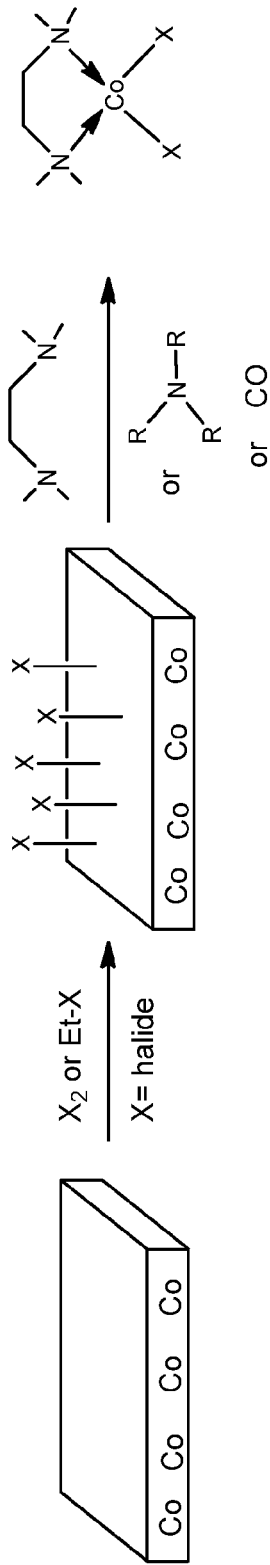
FIG. 1 shows a schematic of a method in accordance with one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

It has been discovered that certain combinations of activation methods and reagents allow for the etching of substrates comprising at least one transition metal. Possible methods for the activation of a substrate surface include exposing the substrate surface to heat, a plasma, an oxidizing environment, or a halide transfer agent. Reagents include Lewis bases and/or pi acids. These processes allow for the formation of volatile metal coordination complexes of the substrate metal, which can then be flowed away or purged from the substrate surface, thereby removing some of the substrate. Certain processes relate to selective metal etching, which allow for removal of one transition metal, while leaving another intact.

Accordingly, one aspect of the invention pertains to a method of etching a substrate. The method comprises activating a substrate surface comprising at least one transition metal. Activation of the substrate surface comprises exposing the substrate surface to heat, a plasma, an oxidizing environment, or a halide transfer agent to provide an activated substrate surface; and exposing the activated substrate surface to a reagent comprising a Lewis base or pi acid to provide a vapor phase coordination complex comprising one or more atoms of the transition metal coordinated to one or more ligands from the reagent.

A "substrate" as used herein broadly covers substrates comprising one or more transition metals. In some embodiments, the term includes equipment that has a layer of buildup deposited thereon. As described above, a common problem with one or more of these deposition processes is the unwanted deposition onto deposition chamber walls, showerhead, etc. Thus, in some embodiments, the substrate comprises deposited metal overlying a deposition chamber wall, a deposition showerhead, etc. In one or more embodiments, the term refers to any substrate or material surface comprising a transition metal that is formed on a second substrate upon which film processing is performed during a fabrication process. Substrates may be exposed to a pretreatment process to polish, etch, reduce, oxidize, hydroxylate, anneal and/or bake the substrate surface. The term "substrate surface" refers to an exposed surface of the substrate. In one or more embodiments, and as the context dictates, as layers are added to the substrate or (in the alternative) part of the substrate is removed, the newly exposed surface becomes the substrate surface.

In one or more embodiments, the substrate surface comprises at least one transition metal. In one or more embodiments, the transition metal comprises a first row transition metal. In some embodiments, the transition metal is selected from the group consisting of Co, Cu, Ru, Ni, Fe, Pt, Mn and Pd. In some embodiments, the substrate surface consists essentially of the transition metal. In one or more embodiments, the substrate surface may comprise more than one transition metal, including metal alloys. An example of such a substrate includes a substrate comprising both cobalt and iron.

In other embodiments, the substrate surface comprises at least one transition metal, but also comprises other components. Other components may include carbon. In one or more embodiments, the substrate surface comprises about 90 to about 100% transition metal and 0 to about 10% carbon. Carbide films may be especially seen in embodiments relating to the removal of transition metal carbides deposited onto deposition chamber walls, showerheads, and other equipment components. In some embodiments, the other components may include oxygen, boron, sulfur and/or nitrogen. Therefore, other examples of suitable substrate comprise materials include metal alloys/intermetallics, metal oxides, metal borides, metal sulfides, metal nitrides, metal intermetallic borides, metal intermetallic oxides, metal intermetallic sulfides and metal intermetallic nitrides. To be clear, the above encompasses substrate comprising more than one transition metal as well as additional components. An example of such a material is a substrate comprising cobalt, iron and boron (CoFeB).

Once the surface has been activated and a reagent gas has been flowed over the reactive surface, it is thought that the reagent gas forms a metal coordination complex with one or more of the transition metal atoms from the substrate surface. Ideally, the reaction conditions are chosen so that the formed coordination complex is volatile at a given temperature (i.e., in the vapor phase). Then, the complex may simply be flowed away from the substrate surface and, as appropriate, out of the chamber. That is, in some embodiments, the method further comprises purging the vapor phase coordination complex.

The substrate surface will therefore be at least one metal layer thinner than before the etch process. In some embodiments, the etch process is self-limiting. That is, each time an etch cycle is performed, the same amount of the substrate is removed, although not necessarily at the monolayer. For example, a certain number of Angstroms (e.g., about 7), or several monolayers may be removed per cycle. In these embodiments, one or more layers of transition metal atoms may be reliably removed each cycle. Such a method may be referred to as "alternating exposure etching," where the substrate surface is sequentially or substantially sequentially exposed to reagent and activation agents. As used herein "substantially sequentially" means that the majority of the duration of the pulses does not overlap with the pulse of co-reagent, although there may be some overlap. In other embodiments, the process may be self-limiting at the monolayer. That is, in such embodiments, only one layer of transition metal atoms is removed at a time. Such a process may be referred to as "atomic layer etching."

The specific reaction conditions for the etch reactions may be selected based on the properties of the reagents and substrate surface, as well as the pressure used. The etch may be carried out at atmospheric pressure, but may also be carried out at reduced pressure. The substrate temperature should be high enough to keep the formed metal complexes in the gaseous phase and to provide sufficient energy for surface reactions. The properties of the specific substrate, film precursors, etc. may be evaluated using methods known in the art, allowing selection of appropriate temperature and pressure for the reaction.

In some embodiments, the substrate surface temperature is kept below about 500, 475, 450, 425, 400, 375, 350, 325, or 300° C. In embodiments where the etch is utilized for cleaning buildup off of equipment, the substrate temperature may be kept below 250, 225, or 200° C. The substrate surface temperature should be at least about room temperature (23° C.) or at least about 25, 50 or 75° C.

Reagents

In accordance with one or more embodiments of the invention, the reagents comprise a Lewis base or pi acid. A "pi acid," as used herein, refers to a compound that, as a ligand, can accept electron density from a metal into empty pi orbitals as well as donate electron density to the metal via a sigma bond. A "Lewis base," as used herein, refers to a compound that, as a ligand, can donate an electron pair to a metal. There are several suitable reagents for the processes described herein.

In one or more embodiments, the Lewis base or pi acid comprises a chelating amine. In some embodiments, the chelating amine has a structure represented by:

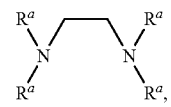

wherein each $R^a$ is independently hydrogen or C1-C4 alkyl group with the proviso that not all of the $R^a$ groups are hydrogen. In further embodiments, the chelating amine is selected from the group consisting of N,N,N',N'-tetramethylethylene diamine (also known as TMEDA), ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is a C1-C6 alkyl group.

In some embodiments, the Lewis base or pi acid comprises CO, alkylphosphines ($PR^1_3$, wherein each $R^1$ is a C1-C6 alkyl group), 1,2-bis(difluorophosphino)ethane, $N_2O$, NO, $NH_3$, $NR^2_3$, wherein each $R^2$ is independently hydrogen or C1-C6 branched or unbranched, substituted or unsubstituted, alkyl, allyl or cyclic hydrocarbon or heteroatomic group, or a compound having the structure:

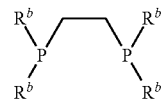

wherein each $R^b$ is independently hydrogen, R or C1-C4 alkyl. It is noted that $N_2O$ is not a traditional Lewis base, but does have a lone electron pair. In some embodiments, wherein the reagent comprises $NR^2_3$, each $R^2$ is independently C1-C6 alkyl. In other embodiments, at least one of the $R^2$ groups is cyclohexylamine.

In one or more embodiments, the pi acid comprises an aluminum precursor. In further embodiments, the aluminum precursor has formula $AlH_nX_mR^c_p$, wherein X is a halogen, the sum of n+m+p is 3, and $R^c$ is C1-C6 alkyl.

Activation

In one or more embodiments, the process includes activation of the substrate surface. In some embodiments, activation of the substrate surface provides a surface termination which will react with a Lewis acid and/or pi acid. In further embodiments, the surface termination will react with any one or more of the Lewis acids and/or pi acids.

In some embodiments, activation of the substrate surface is accomplished by heating the substrate surface. Heating the substrate surface can be carried out by methods known in the art, including simply heating the chamber. In some embodiments, the substrate surface temperature is kept below about 400, 375, 350, 325, or 300° C. In embodiments where the etch is utilized for cleaning buildup off of equipment, the substrate temperature may be kept below 250, 225, or 200° C. The substrate surface temperature should be at least about room temperature (23° C.) or at least about 25, 50 or 75° C.

With processes that include heating, a reagent gas may be passed over the heated substrate. The substrate surface may be heated and exposed to the reagent gas simultaneously or substantially simultaneously. As used herein, the phrase "exposure of the substrate surface to heat and the reagent occur substantially simultaneously" means that the substrate surface is heated with a majority of the heating duration overlapping with exposure to the reagent, although they might not be completely co-extensive. In some embodiments, the reagent gas utilized after heating the substrate comprises one or more of CO, $PR^1_3$, $N_2O$, NO, $NH_3$, $NR^2_3$, wherein each $R^1$ is a C1-C6 alkyl group and each $R^2$ is C1-C6 branched or unbranched, substituted or unsubstituted, alkyl, allyl or cyclic hydrocarbon or heteroatomic group. In other embodiments, the reagent gas comprises a chelating amine, such as N,N,N'N'-tetramethylethylene diamine and N,N'-dimethylethylenediamine.

In some embodiments, activation of the substrate surface comprises exposing the substrate surface to a plasma. The substrate surface may be exposed to the plasma and the reagent gas sequentially, substantially sequentially, simultaneously or substantially simultaneously. As used herein, the phrase "exposure of the substrate surface to the plasma and the reagent occur substantially sequentially" means that the substrate surface is exposed to the plasma with a majority of the plasma exposure duration not coinciding with exposure to the reagent, although there may be some overlap. As used herein, the phrase "exposure of the substrate surface to the plasma and the reagent occur substantially simultaneously" means that the substrate surface is exposed to the plasma with a majority of the plasma exposure duration overlapping with exposure to the reagent, although they might not be completely co-extensive.

Generally, a plasma used for activation should enhance the reactivity of the surface toward subsequent reagent exposure steps. In one or more embodiments, the plasma comprises $H_2$, NO, $N_2O$, $NF_3$, $Cl_2$, Ar or $N_2$. In some embodiments, the plasma changes the substrate surface by adding a different surface termination. For example, in embodiments where the substrate surface is exposed to a plasma comprising $N_2O$, the exposure to the plasma is thought result in a —NO surface termination. While not wishing to be bound to any particular theory, it is thought that by adding such functionality, the substrate surface becomes more reactive to certain reagents, particularly one or more of the pi acids and/or Lewis bases described herein.

In some embodiments, exposure to the substrate surface comprises exposing the substrate surface to a halide transfer agent. In one or more embodiments, exposure of the substrate surface to the halide transfer agent and any pi acid and/or Lewis base occurs sequentially or substantially sequentially As used herein, the phrase "exposure of the substrate surface to the halide transfer agent and the reagent occur substantially sequentially" means that the substrate surface is exposed to the halide transfer agent with a majority of the halide transfer agent exposure duration not coinciding with exposure to the reagent, although there may be some overlap. In some embodiments, exposure of the substrate surface to the halide transfer agent and any pi acid and/or Lewis base occurs simultaneously or substantially simultaneously. As used herein, "substantially simultaneously" means that the substrate surface is exposed to the halide transfer agent with a majority of the halide transfer agent exposure duration coinciding with exposure to the reagent, although there may be some time where the two do not overlap. Again, while not wishing to be bound to any particular theory, it is thought that exposure of the substrate surface to a halide transfer agent results in the substrate surface having halide surface terminations, thereby making it more reactive to one or more of the pi acids and/or Lewis bases described herein. In some embodiments, the halide transfer agent comprises a dihalide. In further embodiments, the dihalide comprises $I_2$, $Br_2$, $Cl_2$. In other embodiments, the halide transfer agent comprises a trialkylsilyl halide or an alkyl halide, wherein the alkyl group(s) of either the trialkylsilyl halide or alkyl halide may be a C1-C6 alkyl group. Examples of suitable alkyl halides include ethyliodide and diiodoethane.

In some embodiments, activation of the substrate surface comprises exposing the substrate surface to an oxidizing environment. In one or more embodiments, exposure of the substrate surface to the halide transfer agent and any pi acid and/or Lewis base occurs sequentially or substantially sequentially. As used herein, the phrase "exposure of the substrate surface to the oxidizing environment and the reagent occur substantially sequentially" means that the substrate surface is exposed to the oxidizing environment with a majority of the oxidizing environment exposure duration not coinciding with exposure to the reagent, although there may be some overlap. In one or more embodiments, exposure to an oxidizing environment comprises exposing the substrate surface to $O_2$, $O_3$, $N_2O$, NO, $Br_2$, $F_2$, $I_2$ or $Cl_2$.

In some embodiments, the reagent gas utilized after exposing the substrate to an oxidizing environment comprises one or more of CO, $PR^1_3$, $N_2O$, NO, $NH_3$, $NR^2_3$, wherein each $R^1$ is a C1-C6 alkyl group and each $R^2$ is C1-C6 branched or unbranched, substituted or unsubstituted, alkyl, allyl or cyclic hydrocarbon or heteroatomic group. In other embodiments, the reagent gas comprises a chelating amine, such as N,N, N'N'-tetramethylethylene diamine and N,N'-dimethylethylenediamine. In other embodiments, the reagent gas utilized after exposing the substrate to an oxidizing surface comprises an aluminum-containing precursor, such as chloroalkylaluminums, aluminum trihalides, aluminum halide hydrides, alkyl aluminum hydride.

It should be noted that any of the above activation processes and/or reagents may be combined. That is, more than one activation process may be utilized, or more than one reagent may be used during a given etch sequence. Furthermore, it is to be understood that the process may be repeated until the desired amount of transition metal has been etched away.

Selective Etch Process

One or more of the processes described herein may be utilized for selective etching. Accordingly, another aspect of the invention relates to a method of etching a multi-layer substrate. The method comprising providing a multi-layer substrate comprising two or more of a layer of Co, a layer of Cu and a layer of Ni; activating a surface of the layer of Co, layer of Cu or layer of Ni, wherein activation of the substrate surface comprises exposing the substrate surface to heat, a plasma or a halide transfer agent to provide an activated substrate surface; and exposing the activated substrate surface to a chelating amine at a first temperature such that the chelating amine will only form a volatile metal coordination complex with one of Co, Cu or Ni at the first temperature. As discussed above, in one or more embodiments, the multi-layer substrate may comprise another component selected from the group consisting of oxygen, boron, carbon, sulfur, nitrogen, and combinations thereof.

Generally, this process can be used to etch one of Co, Cu or Ni at a time. That is, in one or more embodiments, Co can be removed without disturbing Cu or Ni layers, Cu can be removed without disturbing Co or Ni layers, and Ni can be removed without disturbing Co or Cu layers. Once one of these layers is removed, the temperature may be changed to remove a different metal. Thus, in some embodiments, the method further comprises exposing the activated substrate surface to a chelating amine at a second temperature, such that the chelating amine will only form a volatile metal coordination complex with one of Co, Cu or Ni at the second temperature.

In some embodiments, the chelating amine has a structure represented by:

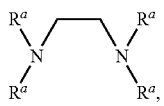

wherein each $R^a$ is independently H or C1-C4 alkyl, with the proviso that not all of the $R^a$ groups are hydrogen. In one or more embodiments, the chelating amine is selected from the group consisting of N,N,N',N'-tetramethylethylene diamine and N,N'-dimethylethylenediamine.

While not wishing to be bound to any particular theory, it is thought that Ni, Co and Cu form coordination metal complexes with the above chelating amine with different volatilities at different temperatures. Thus, temperature may be controlled as a parameter to complex one metal at a time, while leaving the other two metals undisturbed. The specific temperatures will depend on the specific metal and chelating amines selected.

Exemplary Processes

Several processes will be exemplified below and in the figures. It is to be understood that the structures shown are representative of the chemical mechanisms that are thought to be occurring during the etch process. However, they are not intended to be limiting, and other chemical structures may occur.

FIG. 1 illustrates an exemplary process in accordance with one or more embodiments of the invention. Specifically, a thermal etching process using halide activation and a Lewis base is shown. First, a cobalt substrate surface is provided. The substrate surface is exposed to a halide transfer agent. The halide transfer agent may be a dihalide or an alkyl halide such as an ethyl halide. An exemplary process may utilize $Br_2$ at a substrate temperature of at least about 200° C.

Once the substrate surface is exposed to the halide transfer agent, the surface is modified with halide termination/surface functionality to provide an activated substrate surface. Next, activated substrate surface is exposed to a Lewis base and/or pi acid. FIG. 1 is shown with N,N,N',N'-tetramethylethylenediamine (TMEDA) or a tertiary amine or a CO reagent. Once the activated substrate surface is exposed to the reagent, the reagent complexes a metal atom from the substrate surface. As shown in the process of FIG. 1, where TMEDA is utilized as the reagent, it may complex a cobalt atom, resulting in a metal coordination complex with the cobalt coordinated to the N,N,N',N'-tetramethylethylenediamine and two halide ligands. The formed cobalt complex may then be purged away from the substrate surface, taking away at least one cobalt atom from the original substrate surface.

Figure 2:
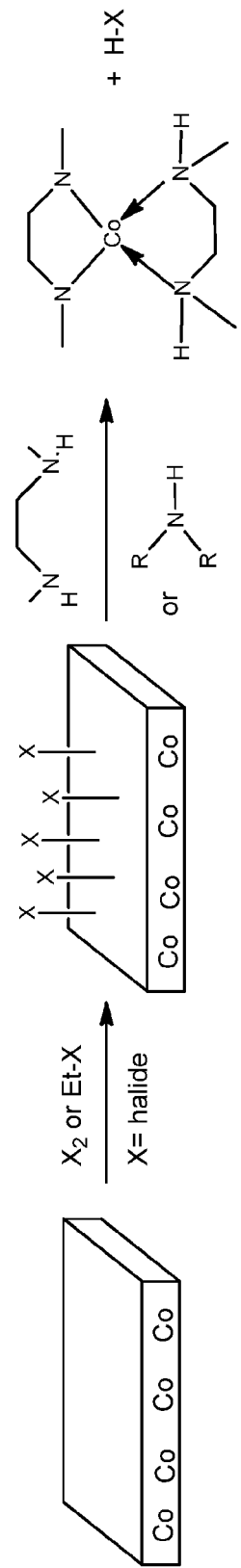
FIG. 2 shows a schematic of a method in accordance with one or more embodiments of the invention.

FIG. 2 illustrates a process similar to FIG. 1, but instead uses N,N'-dimethylethylenediamine and secondary amines, protonated versions of TMEDA or tertiary amine respectively. A cobalt substrate surface is again provided, and it is exposed to a halide transfer agent to provide an activated surface. The activated substrate surface is exposed to the N,N'-dimethylethylenediamine or secondary amine reagent. The cobalt halide may act as a reactive handle to generate cobalt amides in a metathesis reaction. With these reagents, it is thought that the complexed cobalt will contain two N,N'-dimethylethylenediamine or secondary amine ligands, at least one of which would form a covalent bond with the central metal atom. The other ligand is shown as forming a dative bond. The process in FIG. 2 is shown having a hydrogen halide byproduct. For example, where $Br_2$ is used, HBr would be formed as a byproduct. It is thought that a hydrogen halide byproduct would help to increase the vapor pressure, so that the etch can be carried out at a lower temperature.

Figure 3:
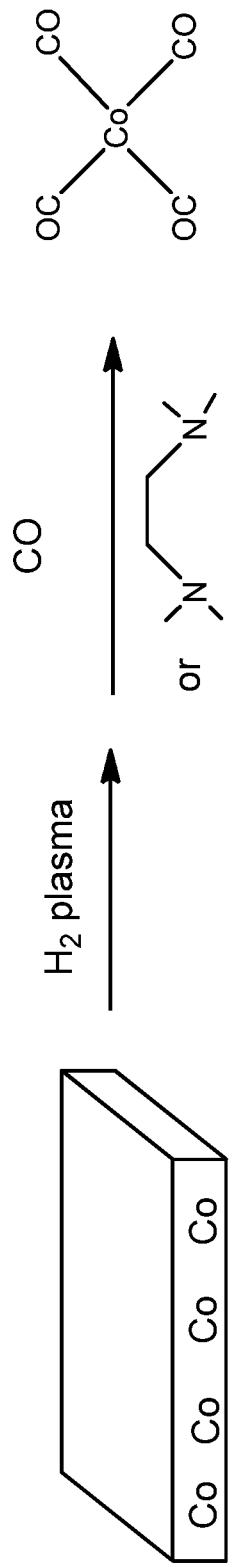
FIG. 3 shows a schematic of a method in accordance with one or more embodiments of the invention.

FIG. 3 illustrates an etch process based on plasma activation. A cobalt surface is again provided. The substrate surface is exposed with a plasma (shown as $H_2$), while simultaneously exposed to a Lewis base (shown as either CO or TMEDA). Once the activated substrate surface is exposed to the reagent, the reagent complexes a metal atom from the substrate surface. As shown in the process of FIG. 3, where CO is utilized as the reagent, it may complex a cobalt atom, resulting in a metal coordination complex with the cobalt coordinated to four CO ligands. The formed cobalt complex may then be purged away from the substrate surface, taking away at least one cobalt atom from the original substrate surface.

Figure 4:
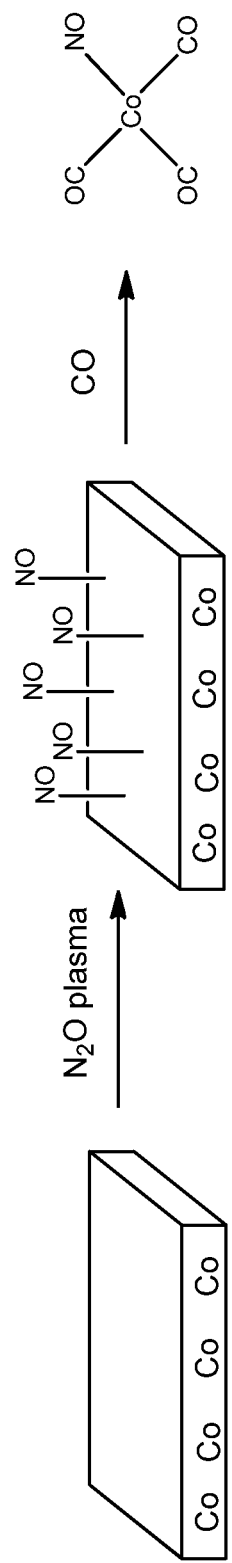
FIG. 4 shows a schematic of a method in accordance with one or more embodiments of the invention.

FIG. 4 illustrates another etch process based on plasma activation. In this process, a cobalt substrate surface is exposed to a $N_2O$ plasma. The plasma activates the surface by creating —NO functionality. The reagent, CO, is then used to complex the cobalt, thought to result in a metal coordination complex having the formula $Co_x(CO)_y(NO)_z$. In one or more embodiments, the complex may comprise a cobalt atom coordinated to three CO ligands and one NO ligand, also known as tetracarbonylcobalt nitrosyl. Tetracarbonylcobalt nitrosyl is known to be quite volatile even at room temperature, which would allow for etching at very low temperatures.

In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during some of the processes disclosed herein, it should be noted that plasmas may not required.

One or more of the processes described herein include a purge. The purging process keeps the reagents separate. The substrate and chamber may be exposed to a purge step after stopping the flow of one or more of the reagents. A purge gas may be administered into the processing chamber with a flow rate within a range from about 10 sccm to about 10,000 sccm, for example, from about 50 sccm to about 5,000 sccm, and in a specific example, about 1000 sccm. The purge step removes any excess precursor, byproducts and other contaminants within the processing chamber. The purge step may be conducted for a time period within a range from about 0.1 seconds to about 60 seconds, for example, from about 1 second to about 10 seconds, and in a specific example, from about 5 seconds. The carrier gas, the purge gas, the deposition gas, or other process gas may contain nitrogen, hydrogen, argon, neon, helium, or combinations thereof. In one example, the carrier gas comprises argon and nitrogen.

According to one or more embodiments, the substrate is subjected to processing prior to and/or after forming etch. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), other etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the chamber to prevent reactants from moving from the chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

In atomic layer deposition-type chambers, the substrate can be exposed to the reagents and/or other compounds either spatially or temporally separated processes. Temporal ALD (or etch) is a traditional process in which the first precursor flows into the chamber to react with the surface. The first precursor is purged from the chamber before flowing the second precursor. In spatial ALD (or etch), both the first and second precursors are simultaneously flowed to the chamber but are separated spatially so that there is a region between the flows that prevents mixing of the precursors. In spatial ALD, the substrate must be moved relative to the gas distribution plate, or vice-versa.

Reference throughout this specification to "one embodiment," "certain embodiments," "one or more embodiments"

or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Example 1

Cobalt Etch at 200-300° C.

Figure 5:
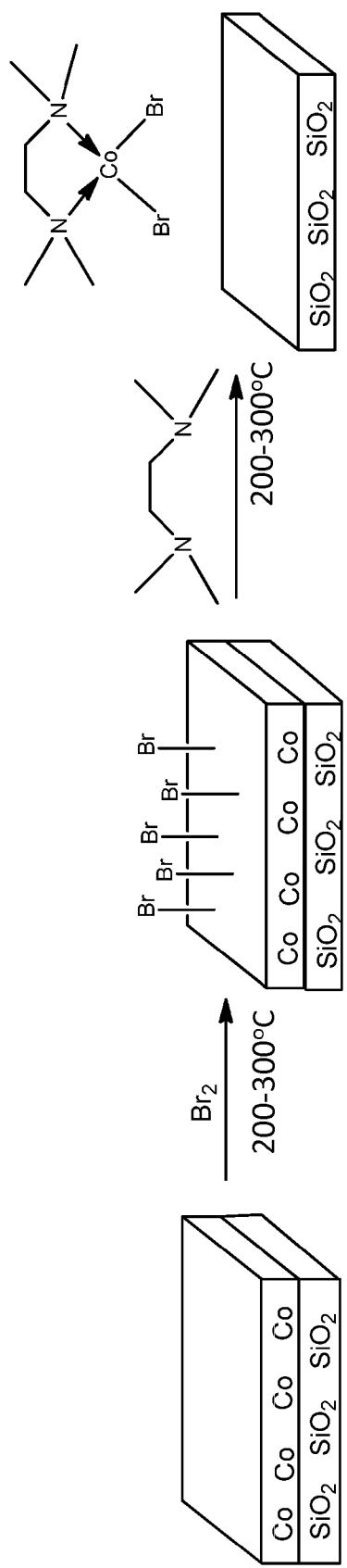
FIG. 5 shows a schematic of a method in accordance with one or more embodiments of the invention.

An air-exposed cobalt coupon deposited via plasma vapor deposition (PVD) and having a thickness of 130 Angstroms was provided. The cobalt coupon was deposited over a silicon substrate. The cobalt coupon was exposed to 0.1 seconds of a $Br_2$ pulse at temperatures between 200 and 300° C., followed by a 4 second purge. The substrate surface was then exposed to a 1 second purge of N,N,N',N'-tetramethylethylenediamine (TMEDA) at temperatures between 200 and 300° C., followed by another 4 second purge. A possible chemical mechanism of this process is shown in FIG. 5.

Figure 6:
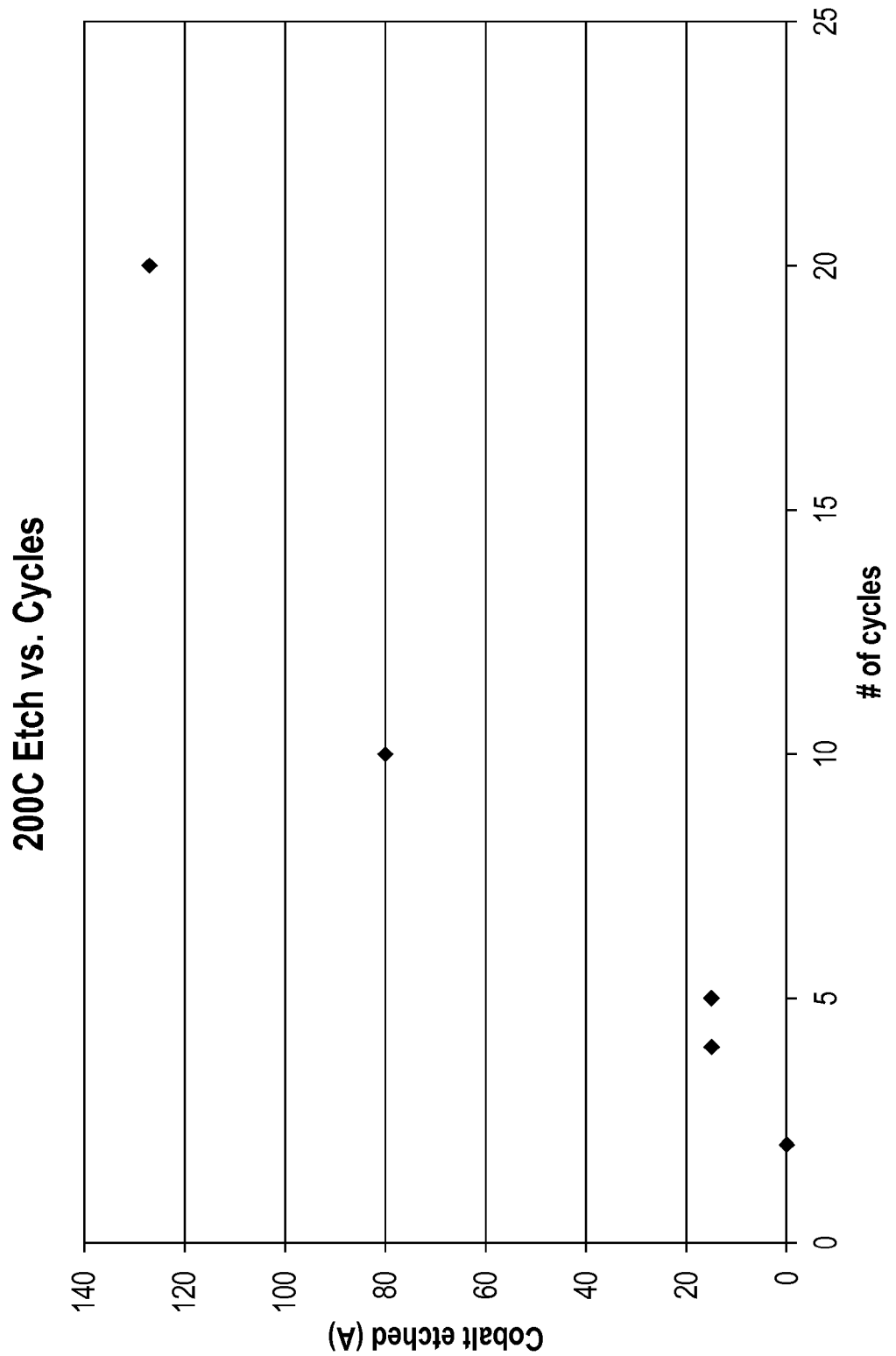
FIG. 6 shows a graph of amount of cobalt etched as a function of cycles for a process in accordance with one or more embodiments of the invention.

After 20 cycles of $Br_2$/TMEDA, all of the cobalt was removed from the coupon, but the $SiO_2$ was undisturbed, as measured by X-Ray Fluorescence spectroscopy. FIG. 6 shows a graph of the cobalt etched in Angstroms as a function of cycles. As shown in the figure, an etch rate of about 7 Angstroms of cobalt was removed per cycle, with a 2-cycle incubation. No etch was observed with either the $Br_2$ or TMEDA pulses are absent, demonstrating that neither regent can etch by itself. This example demonstrates the effectiveness of the etch process, as the cobalt was completely removed without affecting the underlying $SiO_2$ substrate. The process also demonstrated good etch control, with about 7 Angstroms of cobalt being reliably removed per cycles.

Example 2

Cobalt Etch as a Function of Temperature

Figure 7:
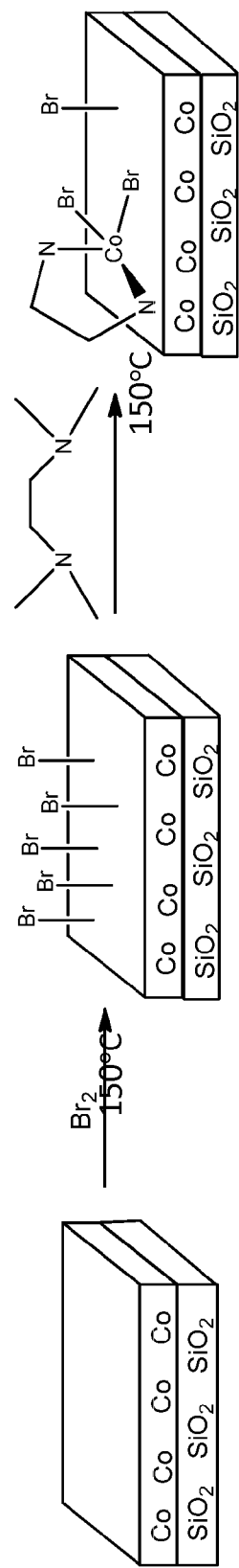
FIG. 7 shows a schematic of a method in accordance with one or more embodiments of the invention.

The etch process of Example 1 was repeated, but the substrate temperature during exposure to $Br_2$ and TMEDA was 150° C. A possible chemical mechanism of this process is shown in FIG. 7. A roughening of the surface was observed, but very little change in terms of Co counts. It is thought that the reaction is occurring, but that the resulting Co complex is not volatile at 150° C. This demonstrates that the temperature must be selected for the specific complexes formed to ensure that the complex is volatile enough to be able to purge away from the substrate surface.

Figure 8:
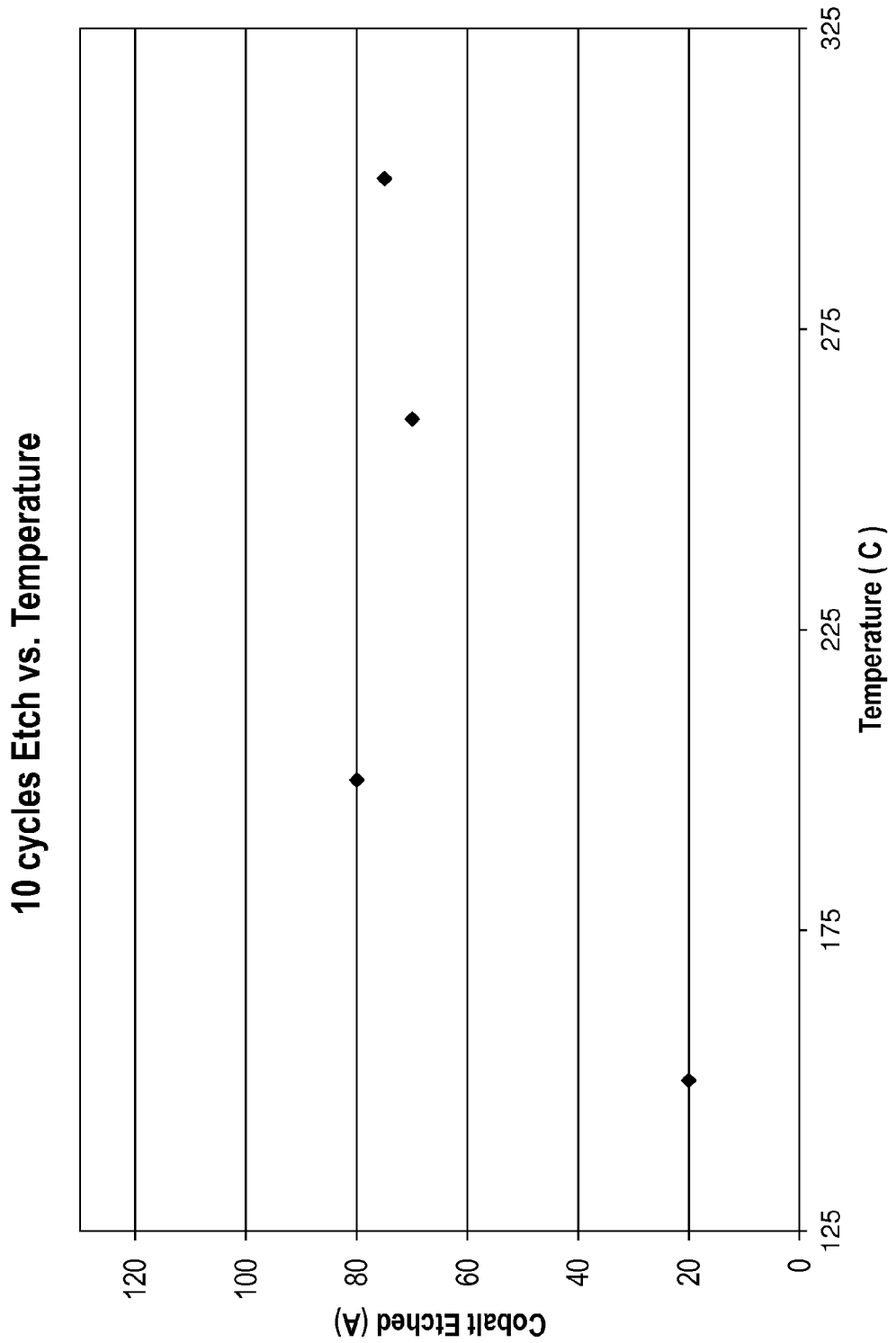
FIG. 8 shows a graph of the amount of cobalt etched as a function of temperature for a process in accordance with one or more embodiments of the invention.

10 cycles of etch using the same process was measured at other temperatures, the results of which are shown in FIG. 8. As seen in the graph, amount of cobalt etched after 10 cycles remained fairly consistent after the temperature reached 200° C. This demonstrates that the etch rate is fairly consistent and independent of temperature once temperature is high enough so that the resulting cobalt complex is volatile.

Example 3

Cobalt Etch as a Function of Purge Time

Figure 9:
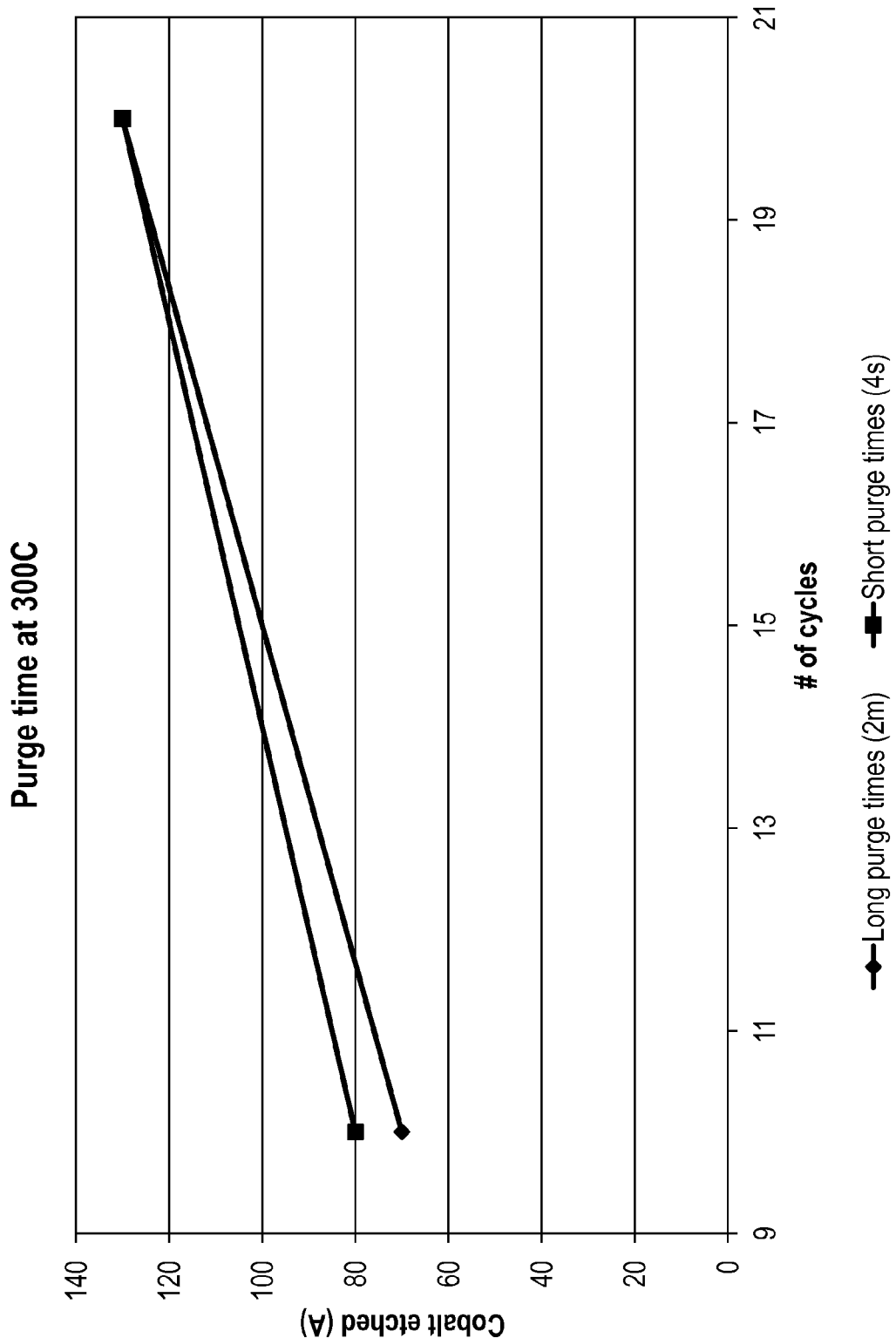
FIG. 9 shows a graph of the amount of cobalt etched as a function of temperature for a process in accordance with one or more embodiments of the invention.

The etch process of Example 1 was repeated twice, but the substrate temperature during exposure to $Br_2$ and TMEDA was 200° C. and the purge time was varied from 4 seconds to 2 minutes. FIG. 9 shows a graph of the cobalt etched in Angstroms versus the number of cycles for a process in which the purge time was 2 minutes and a process in which the purge time was 4 seconds. The amount of cobalt etched was nearly identical for the two processes. This demonstrates that the length of purge time between cycles does not appear to affect the etch rate of the process.

Example 4

Copper Etch Selectivity

Figure 10:
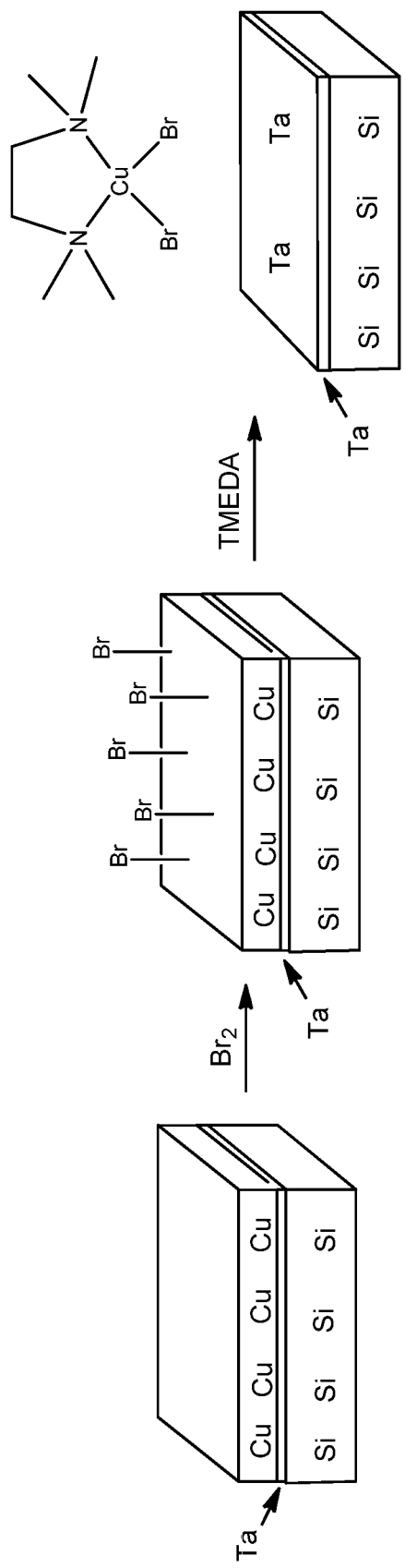
FIG. 10 shows a schematic of a method in accordance with one or more embodiments of the invention.

A copper coupon deposited via PVD and having a thickness of 100-400 Angstroms was provided. The copper coupon overlaid a tantalum layer overlying a silicon substrate. The cobalt coupon was exposed to $Br_2$, followed by treatment with TMEDA at a temperature of 300° C. A possible chemical mechanism of this process is shown in FIG. 10. After 10 cycles, all of the copper was removed from the coupon. After the copper was removed, a shiny silver was observed on the surface that immediately oxidized and peeled away from the substrate on exposure to air. This demonstrates that the copper was completely removed, leaving the underlying tantalum layer completely untouched, signifying that the process was selective for copper over tantalum.

What is claimed is:
1. A method of etching a substrate, the method comprising:
    activating a substrate surface comprising a transition metal, wherein activation of the substrate surface comprises exposing the substrate surface to heat, a plasma, an oxidizing environment, or a halide transfer agent to provide an activated substrate surface; and
    exposing the activated substrate surface to a reagent comprising a Lewis base or pi acid to provide a vapor phase coordination complex comprising one or more atoms of the transition metal coordinated to one or more ligands from the reagent
    wherein the Lewis base or pi acid comprises a chelating amine selected from the group consisting of N,N,N',N'-tetramethylethylene diamine, ethylene diamine, N,N'-dimethylethylenediamine, 2-(aminomethyl)pyridine, 2-[(alkylamino)methyl]pyridine, and 2-[(dialkylamino)methyl]pyridine, wherein the alkyl group is C1-C6 alkyl.
2. The method of claim 1, wherein activation of the substrate surface comprises exposing the substrate surface to heat.
3. The method of claim 2, wherein exposure of the substrate surface to heat and the reagent occur sequentially or substantially sequentially.

4. The method of claim 1, wherein activation of the substrate surface comprises exposing the substrate surface to a plasma.

5. The method of claim 4, wherein the plasma comprises $H_2$, NO, $N_2O$, $NF_3$, $Cl_2$, Ar or $N_2$.

6. The method of claim 5, wherein the plasma comprises $N_2O$, and exposure of the substrate surface to the $N_2O$ results in a —NO surface termination.

7. The method of claim 1, wherein activation of the substrate surface comprises exposure to a halide transfer agent.

8. The method of claim 1, wherein exposure of the substrate surface to an oxidizing environment comprises exposing the substrate surface to $O_2$, $O_3$, $N_2O$, NO, $Br_2$, $F_2$, $I_2$ or $Cl_2$.

9. The method of claim 1, wherein the substrate surface comprises about 90 to about 100% transition metal and 0 to about 10% carbon.

10. The method of claim 1, wherein the substrate surface overlies a deposition chamber wall or showerhead.

11. The method of claim 1, wherein the transition metal comprises an element selected from the group consisting of Co, Ru, Ni, Fe, Mn and Pd.

12. A method of etching a multi-layer substrate, the method comprising:
providing a multi-layer substrate comprising two or more of a layer of Co, a layer of Cu and a layer of Ni;
activating a surface of the layer of Co, layer of Cu or layer of Ni, wherein activation of the substrate surface comprises exposing the substrate surface to heat, a plasma or a halide transfer agent to provide an activated substrate surface; and
exposing the activated substrate surface to a chelating amine at a first temperature such that the chelating amine will only form a volatile metal coordination complex with one of Co, Cu or Ni at the first temperature.

13. The method of claim 12, further comprising exposing the activated substrate surface to a chelating amine at a second temperature, such that the chelating amine will only form a volatile metal coordination complex with one of Co, Cu or Ni at the second temperature.

14. The method of claim 10, wherein the chelating amine has a structure represented by:

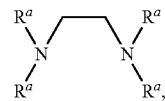

wherein each $R^a$ is independently hydrogen or C1-C4 alkyl, with the proviso that not all of the $R^a$ groups are hydrogen.

15. The method of claim 14, wherein the chelating amine is selected from the group consisting of N,N,N',N'-tetramethylethylene diamine and N,N'-dimethylethylenediamine.

16. The method of claim 15, further comprising purging the coordination complex.

17. A method of etching a substrate, the method comprising:
activating a substrate surface comprising cobalt or copper, wherein activation of the substrate surface comprises exposing the substrate surface to $Br_2$ to provide an activated substrate surface; and
exposing the activated substrate surface to a reagent comprising TMEDA to provide a vapor phase coordination complex comprising one or more atoms of the cobalt or copper coordinated to one or more ligands from the reagent.

* * * * *